United States Patent [19]

Seio et al.

[11] Patent Number: 4,946,757
[45] Date of Patent: Aug. 7, 1990

[54] POSITIVE TYPE 1,2 QUINONE DIAZIDE CONTAINING PHOTOSENSITIVE RESINOUS COMPOSITION WITH ACRYLIC COPOLYMER RESIN

[75] Inventors: Mamoru Seio, Hyogo; Kanji Nishijima, Osaka; Katsukiyo Ishikawa, Kyoto, all of Japan

[73] Assignee: Nippon Paint Co., Ltd., Osaka, Japan

[21] Appl. No.: 255,191

[22] PCT Filed: Feb. 2, 1988

[86] PCT No.: PCT/JP88/00093
 § 371 Date: Oct. 27, 1988
 § 102(e) Date: Oct. 27, 1988

[87] PCT Pub. No.: WO88/05927
 PCT Pub. Date: Aug. 11, 1988

[30] Foreign Application Priority Data

Feb. 2, 1987 [JP] Japan .................................. 62-023114

[51] Int. Cl.$^5$ .............................................. G03F 7/023
[52] U.S. Cl. .................................. 430/192; 430/165; 430/168; 430/169; 430/326
[58] Field of Search ................ 430/192, 165, 197, 176, 430/175

[56] References Cited

U.S. PATENT DOCUMENTS

| | | | |
|---|---|---|---|
| 3,551,154 | 12/1970 | Di Blas et al. | 430/192 |
| 3,637,384 | 1/1972 | Deutsch et al. | 430/192 |
| 3,802,885 | 4/1974 | Lawson et al. | 430/192 |
| 3,890,153 | 6/1975 | Dijkstra et al. | 430/192 |
| 3,900,325 | 8/1975 | Christensen et al. | 430/192 |
| 4,812,549 | 1/1987 | Muramoto et al. | 526/318 |

*Primary Examiner*—Charles L. Bowers, Jr.
*Attorney, Agent, or Firm*—Wenderoth, Lind & Ponack

[57] ABSTRACT

The invention provides a photosensitive resin composition specifically useful for microfabrication resist films and photosensitive materials for use in lithographic plates because of excellent flexibility and adhesion, and moreover, when developed, non-exposed parts being of extremely less swelling nature.

1 Claim, No Drawings

POSITIVE TYPE 1,2 QUINONE DIAZIDE CONTAINING PHOTOSENSITIVE RESINOUS COMPOSITION WITH ACRYLIC COPOLYMER RESIN

This application is a division of application Ser. No. 207,639, filed May 25, 1988, now U.S. Pat. No. 4,879,386.

FIELD OF INVENTION

The present invention relates to a positive type photosensitive resinous composition which is useful in the preparation of microfabrication photoresists for printed wiring boards and integrated circuit boards and photosensitive materials for lithographic plates and the like.

BACKGROUND OF THE INVENTION

Heretofore, positive type photosensitive compositions have been widely used in various technical fields as, for example, preparation of semiconductor equipments, printed wiring boards, printing plates and the like. As the photosensitive composition capable of forming a positive image, i.e. positive type photosensitive composition, use has generally been made of such composition as being prepared by adding a quinone diazide compound to an alkali-soluble novolac resin, thereby rendering the composition hardly soluble in a basic aqueous solution to be used as a developer. This system is characterized by making the best use of the nature that the quinone diazide compound used is inherently insoluble in a basic aqueous solution and only soluble in an organic solvent, but when exposed to ultraviolet rays, the qunione diazide group contained is decomposed, thereby forming, passing through ketene group, a carboxyl group and rendering the compound easily soluble in a basic aqueous solution. Examples of such positive type photosensitizers are 1,2-quinone diazide compounds described in patents and other technical publication's listed at pages 339 to 357, "Light-sensitive systems", J. Kosar (John Wiley & Sons Inc.). Such positive type photosensitive compositions are, in general, far excellent in resolving power than negative type compositions and this is the main reason why they have been advantageously used as etching-proof in the preparation of printed wiring boards and integrated circuit boards. However, in the abovesaid system, there are some problems such that since the novolac resins are prepared by a condensation polymerization process, the products are subject to wide fluctuations in properties and since the softening point is considerably high in despite of a comparatively lower molecular weight of the resin, they are, in general, brittle and also poor in adhesion to a supporting plate when used as a resist film. Therefore, it has long been desired to make up the abovesaid drawbacks. Another proposal has also been made in which a 1,2-quinone diazide compound is admixed with a copolymer of conjugated diolefinic hydrocarbon, monoolefinically unsaturated compound and $\alpha,\beta$-ethylenically unsaturated carboxylic acid (Japanese Patent Application Kokai No. 122031/81). In this system, it is said that flexibility and adhesion to a supporting plate is considerably good. However, in order to make this system alkali-soluble by photo-irradiation, it is essential that the content of $\alpha,\beta$-ethylenically unsaturated carboxylic acid in the resin be increased to a considerably higher level, which, in turn, will cause additional problem such that at the developing stage, the unexposed image area be liable to be swelled, thereby lowering the resolving power of the system. It is, therefore, a principal object of the present invention to provide a positive-type photosensitive resinous composition which is excellent in flexibility and adhesion, and moreover, capable of resulting a coating whose parts will give the least undesired swelling at the development stage.

Disclosure of invention

In accordance with the present invention, the above-said object can be attained with a positive-type photosensitive resinous composition comprising a qunione diazide compound and an acrylic resin bearing at least one side chain having the structure of

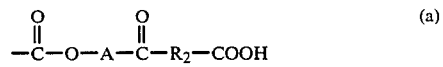
(a)

wherein $R_2$ is a substituted or unsubstituted aliphatic hydrocarbon of 2 to 10 carbon atoms, alicyclic hydrocarbon of 6 to 7 carbon atoms or aromatic hydrocarbon of 6 carbon atoms; A is a repeating unit of the formula;

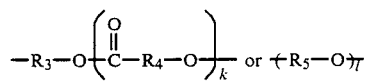

wherein $R_3$ is ethylene or propylene; $R_4$ is a substituted or unsubstituted alkylene of 2 to 7 carbon atoms; $R_5$ is a substituted or unsubstituted alkylene of 2 to 5 carbon atoms; k and l each represents an average repeating unit number and k is 1 to 10 and l is 2 to 50; or

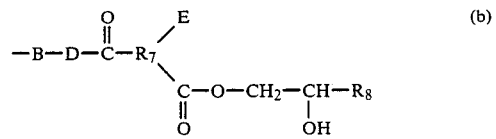
(b)

wherein $R_7$ is a substituted or unsubstituted aliphatic hydrocarbon of 5 to 10 carbon atoms, alicyclic hydrocarbon of 6 to 7 carbon atoms or aromatic hydrocarbon of 6 to 13 carbon atoms; $R_8$ is aliphatic hydrocarbon of 1 to 30 carbon atoms or aromatic hydrocarbon of 6 to 13 carbon atoms optionally substituted with either of vinyl, allyl, ether, ester or carbonyl group singularlily or in combination of more than two in the main chain, and optionally substituted in the side chain(s); B is

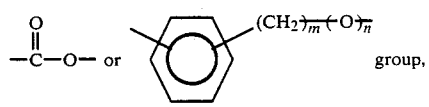
group, wherein m and n are each zero or one independently one another; D is a repeating unit represented by

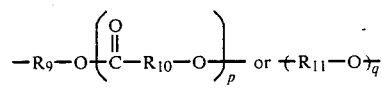

$R_9$ is ethylene or propylene; $R_{10}$ is a substituted or unsubstituted alkylene of 2 to 7 carbon atoms; $R_{11}$ is a substituted or unsubstituted alkylene of 2 to 5 carbon atoms; p and q each represents an average repeating unit number, and p is 1 to 10 and q 2 to 50; E is carboxylic acid, sulfonic acid, phosphoric acid or phosphorus acid group.

Best mode of the invention

The present acrylic resin can be advantageously prepared by polymerizing an acrylic monomer of the formula;

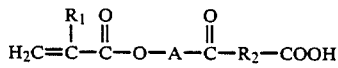  [I]

wherein $R_1$ is hydrogen or methyl group and $R_2$ is optionally substituted aliphatic hydrocarbon of 2 to 10 carbon atoms, alicyclic hydrocarbon of 6 to 7 carbon atoms or aromatic hydrocarbon of 6 carbon atoms; A is a repeating unit having the structure

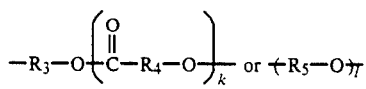

wherein $R_3$ is ethylene or propylene: $R_4$ is optionally substituted alkylene of 2 to 7 carbon atoms; $R_5$ is optionally substituted alkylene of 2 to 5 carbon atoms; k and l are each an average of the number of the repeating unit respectively and k is a value defined within the range from 1 to 10 and l within the range from 2 to 50; or

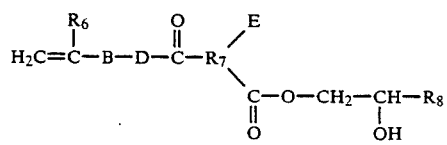  [II]

wherein $R_6$ is hydrogen or methyl group and $R_7$ is optionally substituted aliphatic hydrocarbon of 5 to 10 carbon atoms, alicyclic hydrocarbon of 6 to 7 carbon atoms or aromatic hydrocarbon of 6 to 13 carbon atoms; $R_8$ is aliphatic hydrocarbon of 1 to 30 carbon atoms or aromatic hydrocarbon of 6 to 13 carbon atoms optionally substituted with either of vinyl, allyl, ether, ester or carbonyl group singularlily or in combination of more than two in the main chain, and optionally substituted in the side chain(s); B is

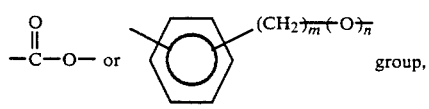 group, wherein m and n are each zero or one independently one another; D is a repeating unit represented by the structure

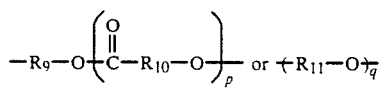

$R_9$ is ethylene or propylene; $R_{10}$ is unsubstituted or substituted alkylene of 2 to 7 carbon atoms; $R_{11}$ is unsubstituted or subsutituted alkylene of 2 to 5 carbon atoms; p and q are each an average of the number of the respective repeating unit, and p is a value from 1 to 10 and q is a value from 2 to 50; E is carboxylic acid, sulfonic acid, phosphoric acid or phosphorus acid group, and other $\alpha,\beta$-ethylenically unsaturated copolymerizable monomer. In general, the weight ratio of the acrylic monomers to other monomers is from 3:97 to 80:20. Also, in order to control coating characteristics and the dissolution speed to a basic aqueous solution, said other monomers may partly include an unsaturated monomer(s) having at least one acidic group selected from the group consisting of $\alpha,\beta$-ethylenically unsaturated carboxylic acid, $\alpha,\beta$-ethylenically unsaturated sulfonic acid, $\alpha,\beta$-ethylenically unsaturated phosphoric acid and salts thereof, other than reactive acrylic monomers with a comparatively long side chain bearing an acidic group represented by the formula [I] or [II]. The weight ratio of such acidic monomers to the rest of the monomers is defined from 0:100 to 15:85. As compared with acrylic resins into which hithertofore used $\alpha,\beta$-ethylenically unsaturated acids with short side chains are introduced, the abovesaid acrylic resin composition into which reactive acrylic monomers having comparatively long side chains and acidic groups has higher solubility to a basic aqueous solution at the same acidic group equivalent and even when a quinone diazide compound is mixed together, light-exposed parts thereof have higher solubility and unexposed parts have very low swelling property during the time when the abovesaid light-exposed parts are dissolved out, and moreover, the introduction of the abovesaid reactive acrylic monomers gives flexibility to the resin and there is no problem of brittleness which has been a problem with regard to phenol resin compositions. The reactive acrylic monomers represented by the formula [I]can be advantageously prepared by polymerizing preferably in the presence of a radical polymerization inhibitor, an end hydroxyl group containing (meth)acrylate having the structure

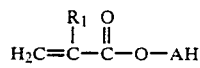  [III]

wherein $R_1$ is hydrogen or methyl group; A is a repeating unit having the structure

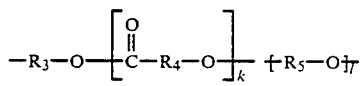

wherein $R_3$ is ethylene or propylene; $R_4$ is optionally substituted alkylene of 2 to 7 carbon atoms; $R_5$ is optionally substituted alkylene of 2 to 5 carbon atoms; k and l are each an average of the number of the respective repeating unit and k is a value from 1 to 10 and l from 2 to 50; and an acid anhydride having the structure

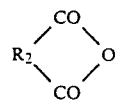  [IV]

wherein $R_2$ is optionally substituted aliphatic hydrocarbon of 2 to 10 carbon atoms, alicyclic hydrocarbon of 6 to 7 carbon atoms or aromatic hydrocarbon of 6 carbon atoms, for instance as described in the specification of our Japanese Patent Application "A reactive acrylic monomer having end carboxyl group and preparation thereof" (Japanese Patent Application No. 001899/86). Also a reactive acrylic monomer represented by the formula [II]can be advantageously prepared by reacting an end hydroxyl containing (meth)acrylate having the structure

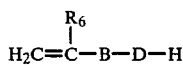   [V]

wherein $R_6$ is hydrogen or methyl group; B is

 group, provided m and n are each zero or one independently from another; D is a repeating unit represented by the structure

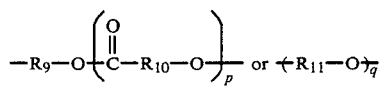

$R_9$ is ethylene or propylene; $R_{10}$ is optionally substituted alkylene of 2 to 7 carbon atoms; $R_{11}$ is optionally substituted alkylene of 2 to 5 carbon atoms; p and q are each an average value of the respective repeating unit, and p is a value from 1 to 10 and q is a value from 2 to 50, with an acid anhydride having the structure

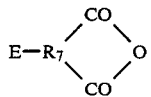   [VI]

wherein $R_7$ is optionally substituted aliphatic hydrocarbon of 5 to 10 carbon atoms, alicyclic hydrocarbon of 6 to 7 carbon atoms or aromatic hydrocarbon or 6 to 13 carbon atoms; $R_8$ is aliphatic hydrocarbon of 1 to 30 carbon atoms or aromatic hydrocarbon of 6 to 13 carbon atoms optionally substituted with either of vinyl, allyl, ether, ester or carbonyl group singularly or in combination of more than two in the main chain, and optionally substituted in the side chain.

E is carboxylic acid, sulfonic acid phosphoric acid or phosphorus acid group, to obtain a compound having the structure

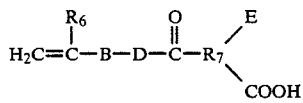   [VII]

wherein $R_6$, $R_7$, B, D, and E are as defined above, and furthermore reacting an epoxy compound having the structure

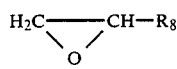   [VIII]

wherein $R_8$ is aliphatic hydrocarbon of 1 to 30 carbon atoms or aromatic hydrocarbon of 6 to 13 carbon atoms optionally substituted with either of vinyl, allyl, ether, ester or carbonyl group singularlily or in combination of more than two in the main chain, and optionally substituted with in the side chain(s), with the abovesaid reaction product[VII]. The other $\alpha,\beta$-ethylenically unsaturated monomers to be copolymerized with thus obtained reactive acrylic monomers having acidic groups and comparatively long side chains may be any of the members customarily used for the preparation of an acrylic resin, which are classified as follows;

(1) acidic group bearing monomers;
 (a) $\alpha,\beta$-ethylenically unsaturated carboxylic acid: as, for example, acrylic acid, methacrylic acid, crotonic acid, itaconic acid, maleic acid, fumaric acid and the like,
 (b) $\alpha,\gamma$-ethylenically unsaturated sulfonic acid: as, for example, 1-acryloxy-1-propanesulfonic acid, 2-acrylamide-2-methyl propanesulfonic acid, 3-methacrylamide-1-haxanesulfonic acid and the like,
 (c) $\alpha,\beta$-ethylenically unsaturated phosphoric acid: as, for example, acid phosphoxy ethyl methacrylate, acid phosphoxy propyl methacrylate and the like, (2) hydroxyl bearing monomers:
 as, for example, 2-hydroxyethyl acrylate, hydroxypropyl acrylate, 2-hydroxyethyl methacryalte, hydroxypropyl methacrylate, hydroxybutyl acrylate, hydroxybutyl methacrylate, allyl alcohol and methallyl alcohol, (3) nitrogen containing alkyl acrylates or methacrylates:
 as, for example, dimethylaminoethyl acrylate, dimethylaminoethyl methacrylate and the like, (4) polymerizable amides;
 as, for example, acrylic amide and methacrylic amide, (5) polymerizable nitriles:
 as, for example, acrylonitrile and methacrylonitrile, (6) alkyl acrylates or methacrylates:
 as, for example, methyl acrylate, methyl methacrylate, ethyl acrylate, ethyl methacrylate, n-butyl acrylate, n-butyl methacrylate and 2-ethylhexyl acrylate, (7) polymerizable aromatic compounds:
 as, for example, styrene, $\alpha$-methyl styrene, vinyl toluene and t-butyl styrene, (8) $\alpha$-olefines:
 as, for example, ethylene and propylene, (9) vinyl compounds:
 as, for example, vinyl acetate and vinyl propionate,

(10) diene compounds:
 as, for example, butadiene, isoprene and the like.

These monomers are used alone or in combination. The polymerization is carried out in a conventional way. At that time, it is preferred to use a polymerization initiator as, for example, an organic peroxide (e.g. benzoyl peroxide, t-butyl peroxide, cumen hydroperoxide and the like), an organic azo compound (e.g. azobiscyanovaleric acid azobisisobutyronitrile, azobis (2,4-dimethyl) valeronitrile, azobis (2-amidinopropane) hydrochloride and the like), an inorganic water soluble radical initiator (e.g. potassium persulfate, ammonium persulfate, sodium persulfate, hydrogen peroxide and the like), a Redox type initiator or the like. A chain transfer agent as, for example, a mercaptan (e.g. ethyl mercaptan, butyl mercaptan, dodecyl mercaptan and the like), a halogenated carbon (e.g. carbon tetrabromide, carbon tetrachloride and the like) may also be used as desired.

Thus obtained acrylic resin of the present invention should have a weight average molecular weight of 1,000 to 200,000, and preferably 3,000 to 100,000. If the weight average molecular weight is more than 200,000, the dissolving speed would become extremely low and impracticable, since the development time would be prolonged. If the weight average molecular weight is less than 1,000, the solubility to an alkaline aqueous solution would be too high and not only the remaining rate would become too low, but so called a pattern-thin-down would occur.

The 1,2-quinone diazide compounds used in the invention are, for example, 1,2-benzoquinone diazido sulfonic acid ester, 1,2-naphthoquinone diazido sulfonic acid ester, 1,2-benzoquinone diazido sulfonic acid amide, 1,2-naphthoquinon diazido sulfonic acid amide and the like, and hitherto known 1,2-quinone diazide compounds can be directly put into use. More specifically, the following quinone diazide compounds which are described at page 339 to 352, J. Kosar, "Light-Sensitive Systems," John Wiley & Sons Inc. (New York), 1965 and at page 50, W. S. De Forest, Photoresist, McGraw Hill Inc. (New York), 1975 can be exemplified.

That is, 1,2-benzoquinone diazido-4-sulfonic acid phenylester, 1,2,1',2'-di(benzoquinone diazido-4-sulfonyl)-dihydroxy biphenyl, 1,2-benzoquinone diazido-4-(N-ethyl-N-$\beta$-naphthyl)-sulfonamide, 1,2-naphthoquinone diazido-5-sulfonic acid cyclohexyl ester, 1-(1,2-naphthoquinone diazido-05-sulfonyl)-3,5-dimethyl pyrazole, 1,2-naphthoquinone diazido-5-sulfonic acid-4'-hydroxydiphenyl-4,-azo-$\beta$-naphthol ester, N,N'-di-(1,2-naphthoquinone diazido-5-sulfonyl)-aniline, 2' (1,2-naphthoquinone diazido-5-sulfonyloxy)-1-hydroxyanthraquinone, 1,2-naphthoquinone diazido-5-sulfonic acid-2,3,4-trihydroxybenzophenone ester, condensate of 2 moles of 1,2-naphthoquinone diazide-5-sulfonic acid chloride and one mol of 4,4'-diaminobenzophenone, condensate of 1,2-naphthoquinone diazido-5-sulfonic acid chloride and one mol of 4,4'-dihydroxy-1,1'-diphenylsulfon, condensate of one mol of 1,2-naphthoquinonew diazido-5-sulfonic acid chloride and one mol of purpurogallin, 1,2-naphthoquinone diazido-5-(N-dihydroabietyl)-sulfonamide and the like.

The weight ratio of said quinone diazide compound to the abovesaid acrylic resin composition should preferably be 5:100 to 150:100 and more preferably 10:100 to 100:100. If the ratio is less than 5:100, trouble as to patterning would arise, since the amount of carboxyl acids to be generated by light absorption is too small and there would be no appreciable difference in solubility to an alkaline aqueous solution between before and after light exposure. If the ratio is more than 150:100, development would become difficult, since on short time light exposure the most of quinone diazide compounds would remain unreacted thereby still possessing high insolubility to an alkaline aqueous solution.

If desired, the positive type photosensitive resin composition of the invention may further contain other conventional additives such as stabilizers, dyestuffs, pigments and the like.

A photosensitive layer can be formed by a process wherein the positive type photosensitive resin composition of the invention comprising the abovesaid constituents is dissolved is an appropriate solvent, then is coated on a supporting substrate by a hitherto known coating method such as spinner and coater, and finally the coated substrate is dried. Examples of such solvents are as follows: glycol ethers as ethyleneglycol monomethyl ether, ethyleneglycol ethyl ether, ethyleneglycol monobutyl ether and the like; cellosolve acetates as methyl cellosolve acetate, ethyl cellosolve acetate and the like; aromatic hydrocarbons as toluence, xylene and the like; ketones as methyl ethyl ketone, cyclohexanone and the like; esters as ethyl acetate, butyl acetate and the like.

These solvents are used alone or in combination. Also examples of supporting substrates are silicone wafer, aluminum plate, plastic film, paper, vitreous plate, copper plate, copper-clad laminate for use in printed wiring boards and the like. They are appropriately used in accordance with an application of the present photosensitive resin composition.

The positive type photosensitive resinous composition comprising a composition comprising a quinone diazide compound and an acrylic resin bearing at least one side chain having the structure

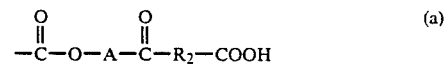

wherein $R_2$ is aliphatic hydrocarbon of 2 to 10 carbon atoms with or without a substituent(s), alicyclic hydrocarbon of 6 to 7 carbon atoms or aromatic hydrocarbon of 6 carbon atoms; A is a repeating unit having the structure

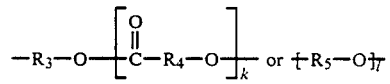

wherein $R_3$ is ethylene or propylene; $R_4$ is alkylene of 2 to 7 carbon atoms with or without a substituent(s); $R_5$ is alkylene of 2 to 5 carbon atoms with or without a substituent(s); k and l is each an average of the number of the respective repeating unit and k is a value from 1 to 10 and l from 2 to 50; or having the structure

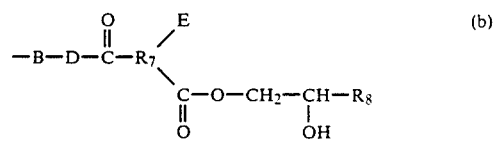

wherein $R_7$ is aliphatic hydrocarbon of 5 to 10 carbon atoms with or without a substituent(s), alicyclic hydrocarbon of 6 to 7 carbon atoms or aromatic hydrocarbon of 6 to 13 carbon atoms; $R_8$ is aliphatic hydrocarbon of 1 to 30 carbon atoms or aromatic hydrocarbon of 6 to 13 carbon atoms with or without either of vinyl, allyl, ether, ester or carbonyl group singularly or in combination of more than two in the main chain, or with or without a substituent(s) in the side chain(s); B is

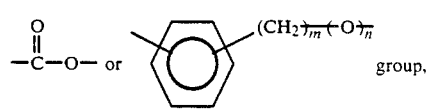

provided m and n is each an integer from 0 to 1 independently one another; D is a repeating unit represented by the structure

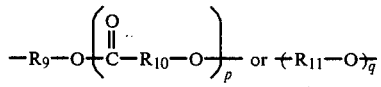

$R_9$ is ethylene or propylene; $R_{10}$ is substituted or not substituted alkylene of 2 to 7 carbon atoms; $R_{11}$ is unsubstituted or substituted alkylene of 2 to 5 carbon atoms; p and q is each an average of the number of the respective repeating unit, and p is a value from 1 to 10 and q is a value from 2 to 50; E is carboxylic acid, sulfonic acid, phosphoric acid or phosphorus acid group, can be used in organic solvent systems, or in aqueous dispersions or aqueous solutions which can be obtained by partly or perfectly neutralizing carboxyl groups thereof. Such aqueous systems can be utilized as a positive type photosensitive resin composition which can be subjected to an anode electrodeposition, wherein any supporting substrate with an electroconducting film, for example, copper-clad laminate, aluminum plate and the like, can be electrodeposited. The present invention shall be now more fully explained in the following Examples. Unless otherwise being stated, all parts and percentages are by weight.

EXAMPLE 1

Into a 1 liter glass flask fitted with a stirrer, a Dimroth condenser, a thermometer and an air inlet tube, were placed 150 parts of succinic anhydride, 385 parts of Placcel FM-1 (1:1 mol adduct of ε-caprolactone and 2-hydroxyethyl methacrylate, trademark of Daicel Chem. Co.) and 500 ppm to the total charged amount of hydroquinone monomethyl ether. While introducing air, the mixture was reacted under stirring at 150° C. (inner temperature) for 40 minutes. After completion of the reaction, the mixture was allowed to cool to a room temperature and the formed crystals of unreacted acid anhydride were filtered off to obtain the desired reactive acrylic monomer product(F), whose acid value was 72 and viscosity (25° C.) was 250 cp. The reaction percentage calculated from the measured acid value was 96%. Into a 1 liter glass flask fitted with a stirrer, a Dimroth condenser, a thermometer, a dropping funnel and a nitrogen gas inlet tube, were placed beforehand 200 parts of ethylene glycol monobutyl ether. Then, the mixture of 100 parts of reactive acrylic monomer product(F), 75 parts of methyl methacrylate, 75 parts of n-butyl acrylate and 10 parts of t-butyl peroxy-2-ethyl hexanoate as a polymerization initiator was dropwise added to the solution through the dropping funnel under stirring at 120° C. for 3 hours to obtain an acrylic resin composition. The acid value of the resultant resin product was 43 and the weight average molecular weight was 30,000.

Then 20 grams of thus obtained resin solution (the solid content of 56% by weight) and 3 grams of 1,2-naphthoquinone diazido-5-sulfonic acid ester of 2,3,4-trihydroxy benzophenone were dissolved in the mixed solvent of 60 grams of ethylene glycol monoethyl ether acetate and 17 grams of methyl ethyl ketone and the resulting solution was filtered through a microfilter of 0.5μ in diameter to obtain a sensitizing solution. Upon application of this sensitizing solution over a silicone oxide film wafer by a spinner, the coated wafer was dried in an oven at 80° C. for 30 minutes. The film thickness thereof was 1.5 μm.

Thus obtained sensitized layer was closely contacted with a line-and-space pattern and the assembly was exposed to the ultraviolet light with the light intensity of 3.5 mW/cm² at 365nm for 30 seconds.

Upon development with 1% aqueous solution of sodium metasilicate at 30° C. for 30 seconds, it was found that 1.0 μm line-and space was resolved and the resist had no peeling and cracking.

Example 2

Into a similar reaction vessel as used in Example 1, were placed 148 parts of phthalic anhydride, 400 parts of Blenmer PP-1000 (5.5:1 mol addition product of propylene oxide and methacrylic acid, trademark of Nippon Yushi), and 500 ppm to the total charged amount of hydroquinone monomethyl ether. While introducing air, the mixture was reacted, under stirring, at 150° C. (inner temperature) for 60 minutes. Thus obtained reactive acrylic monomer product(G) had an acid value of 108 and a viscosity (25° C.) of 300 cp. The reaction percentage was 95%. Following the procedures stated in Example 1, an acrylic resin composition was prepared by employing the following formulation:

| | |
|---|---|
| monomer (G) | 75 parts |
| n-butyl acrylate | 75 parts |
| acrylonitrile | 25 parts |
| ethylene glycol monobutyl ether | 180 parts |

Thus obtained reaction product had an acid value of 40.2 and a weight average molecular weight of 32,000.

Then 20 grams of thus obtained resin solution (the solid content of 58% by weight) and 7 grams of 1,2-naphthoquinon diazido-5-sulfonic acid ester of 2,3,4-trihydroxy benzophenone were dissolved in the mixed solvent of 80 grams of ethylene glycol monoethyl ether acetate and 25 grams of methyl ethyl ketone and the resulting solution was filtered through a microfilter of 0.5μ in diameter to obtain a sensitizing solution.

Thus obtained sensitizing solution was evaluated following the procedures stated in Example 1.

Example 3

Into a similar reaction vessel as used in Example 1, were placed 77 parts of trimellitic anhydride, 300 parts of Placcel FM-5 (5:1 mol addition product of ε-caprolactone and 2-hydroxyethyl methacrylate, trademark of Daicel Chem. Co.) and 500 ppm to the total charged amount of hydroquinone monomethyl ether. While introducing air, the mixture was stirred at 165° C. for 30 minutes to proceed the reaction. Thereafter the reaction mixture was subjected to a hot filtration to remove a small quantity of unreacted materials.

Thus obtained intermediate product(H) had an acid value of 125 and was a semi-solid product at 25° C. Then, 100 parts of Cardura E-10 (glycidyl versatate, trademark of Shell Chemical Co.) were added to the intermediate product(H) obtained by the abovesaid preparation procedure. While introducing air again, the mixture was stirred at 150° C. (inner temperature) for 40 minutes to proceed the reaction.

Thus obtained reactive acrylic monomer(I) had an acid value of 52 and a viscosity of 400 cp (25° C.). The reaction percentage determined from the acid value was found to be 95%.

Following the procedures stated in Example 1, an acrylic resin composition was prepared by employing the following formulation:

| monomer [I] | 77.0 parts |
|---|---|
| methacrylic acid | 6.2 parts |
| methyl methacrylate | 80.0 parts |
| n-butyl acrylate | 36.8 parts |
| ethyleneglycol monobutyl ether | 164.0 parts |

Thus obtained reaction product had an acid value of 40.5 and a weight average molecular weight of 27,000.

Then 20 grams of thus obtained resin solution (the solid content of 55% by weight) and 3 grams of 1,2-naphthoquinone diazido-5-sulfonic acid ester of 2,3,4-trihydroxy benzophenone were dissolved in the mixed solvent of 60 grams of ethylene glycol monoethyl ether acetate and 17 grams of methyl ethyl ketone and the resulting solution was filtered through a microfilter of $0.5\mu$ in diameter to obtain a sensitizing solution.

Thus obtained sensitizing solution was evaluated following the procedures stated in Example 1.

Example 4

Into a similar reaction vessel as used in Example 1, were placed 92 parts of sulfophthalic anhydride, 388 parts of 10:1 mol addition product of tetrahydrofuran and methacrylic acid and 500 ppm to the total charged amount of hydroquinone monomethyl ether. While introducing air, the mixture was stirred at 170° C. for 30 minutes to proceed the reaction. Thereafter the reaction mixture was subjected to a hot filtration to remove a small quantity of unreacted materials.

Thus obtained intermediate product(J) had an acid value of 108 and was a semi-solid product at 25° C.

Into a similar reaction vessel as used in Example 1, were placed 94 parts of glycidyl-p-tertiarybutyl benzoate (Fuso Chemical Co.) in addition to the intermediate product(J) obtained by the abovesaid preparation procedure. While introducing air again, the mixture was stirred at 150° C. (inner temperature) for 40 minutes to proceed the reaction. Thus obtained reactive acrylic monomer(K) had an acid value of 48 and a viscosity of 350 cp (25° C.). The reaction percentage determined from the acid value was found to be 90%.

Following the procedures stated in Example 1, an acrylic resin composition was prepared by employing the following formulation:

| monomer [K] | 40.6 parts |
|---|---|
| methacrylic acid | 6.2 parts |
| methyl methacrylate | 60.0 parts |
| ethyl acrylate | 92.2 parts |
| ethyleneglycol monobutyl ether | 164.0 parts |

Thus obtained reaction product had an acid value of 31.0 and a weight average molecular weight of 25,000.

Then 20 grams of thus obtained resin solution (the solid content of 55% by weight) and 7 grams of 1,2-naphthoquinone diazide-5-sulfonic acid ester of 2,3,4-trihydroxy benzophenone were dissolved in the mixed solvent of 80 grams of ethylene glycol monoethyl ether acetate and 25 grams of methyl ethyl ketone and the resulting solution was filtered through a microfilter of $0.5\mu$ in diameter to obtain a sensitizing solution.

Thus obtained sensitizing solution was evaluated following the procedures stated in Example 1.

Example 5

20 grams of acrylic resin composition obtained from Example 1 and 13 grams of 1,2-naphthoquinone diazido-5-sulfonic acid ester of 2,3,4-trihydroxy benzophenone were dissolved in the mixed solvent of 80 grams of ethylene glycol monoethyl ether acetate and 48 grams of methyl ethyl ketone and the resulting solution was filtered through a microfilter of $0.5\mu$ in diameter to obtain a sensitizing solution.

Thus obtained sensitizing solution was evaluated following the procedures stated in Example 1.

Example 6

20 grams of acrylic resin composition obtained from Example 1 and 0.6 grams of 1,2-naphthoquinone diazido-5-sulfonic acid ester of 2,3,4-trihydroxy benzophenone were dissolved in the mixed solvent of 50 grams of ethyleneglycol monoethyl ether acetate and 14 grams of methyl ethyl ketone and the resulting solution was filtered through a microfilter of $0.5\mu$ in diameter to obtain a sensitizing solution.

Thus obtained sensitizing solution was evaluated following the procedures stated in Example 1.

Example 7 (Evaluated as an electrodeposition composition)

The solution of 15 parts of 1,2-naphthoquinone diazido-5-sulfonic acid ester of 2,3,4-trihydroxy benzophenone dissolved in 60 parts of methyl ethyl ketone was added to 100 parts of acrylic resin composition solution prepared in Example 1 and furthermore 3.7 parts of triethyl amine was added thereto and the mixture was dissolved in the solution and was gradually diluted with 1500 parts of deionized water to make up an electrodeposition composition.

Thereafter an insulating base plate with 0.6 mm through-holes was dipped into the electrodeposition bath and was non-electrolytic and electrolytic copper plated respectively. That is, a two-sided circuit base plate with copper thickness 35 $\mu$m was dipped into the electrodeposition bath, the base plate was connected to an anode and the metallic wall of the bath to a cathode. Thereafter, 100 V direct was impressed for 2 minutes.

The plate was then washed with water and dried in an oven maintained at 100° C. for 5 minutes to form a coating of the positive type photosensitive resin in 8 $\mu$m thickness. This coating has no pinhole, a uniform coating thickness and the walls of the through-holes were perfectly covered. On said photosensitive resin composition coatings were placed a positive type photo-tool mask with a circuit pattern, and the circuit base plate was exposed from both sides by the ultraviolet light with the light intensity of 3.5 mW/cm$^2$ at 365 nm for one minute.

Upon development with 1% aqueous solution of sodium metasilicate at 30° C. for one minute, it was found that line widths with high fidelity were reproduced and there was no resist peeling and cracking.

Thereafter copper at exposed parts was etched by ferric chloride solution, washed by water, and the resin coating on the circuit resin plate was removed with 3% sodium hydroxide aqueous solution at 50° C. to obtain the desired circuit pattern with the minimum circuit line width of 3$\mu$m. At this time, unexposed copper on the wall of the through-holes remained perfectly unetched, and it accounts for the fact that the conductivity on both sides was secured and the resin coverage was perfect.

Possibility of industrial application

As stated above, the positive type photosensitive resin composition of the present invention is useful for microfabrication resist films and photosensitive materials for use in lithographic plates because of excellent flexibility and adhesion, and moreover, when developed, non-exposed parts being of extremely less swelling nature.

TABLE 1

| Examples | 1 | 2 | 3 | 4 | 5 | 6 |
|---|---|---|---|---|---|---|
| Adhesion to the wafer *1 | excellent | excellent | excellent | excellent | excellent | excellent |
| resolving power (μm) | 1.0 | 0.9 | 1.1 | 1.0 | 0.9 | 0.7 |

*1 The photosensitive coating film formed and dried was cut with a cutter to give a scar, and cracks and peels of the coating film thereby given rise to were observed.

What is claimed is:

1. A positive type photosensitive resinous composition which comprises an a admixture of photosensitive 1,2 quinone diazide compound and an acrylic resin obtained by polymerizing 3 to 80 parts by weight of an acrylic monomer represented by the formula:

$$H_2C=C\overset{R_1}{\underset{}{|}}\overset{O}{\underset{}{\overset{\|}{C}}}-O-A-\overset{O}{\underset{}{\overset{\|}{C}}}-R_2-COOH \quad (I)$$

wherein $R_1$ is hydrogen or a methyl group, $R_2$ is an aliphatic hydrocarbon of 2 to 10 carbon atoms, an alicyclic hydrocarbon of 6 to 7 carbon atoms or an aromatic hydrocarbon of 6 carbon atoms, A is a repeating unit of the formula:

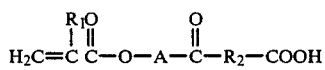

in which $R_3$ is ethylene or propylene, $R_4$ is alkylene of 2 to 5 carbon atoms, k an l each is an average number of the parenthesized group and k is 1 to 10 and l is 2 to 50, or the formula:

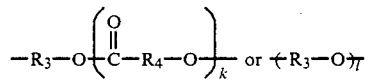

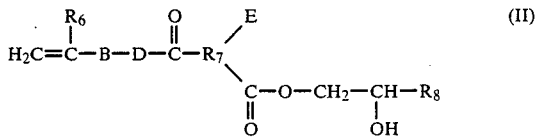

wherein $R_6$ is hydrogen or a methyl group, $R_7$ is an aliphatic hydrocarbon of 5 to 10 carbon atoms, an alicyclic hydrocarbon or 6 to 7 carbon atoms or an aromatic hydrocarbon of 6 to 13 carbon atoms, $R_8$ is an aliphatic hydrocarbon of 1 to 30 carbon atoms, an aromatic hydrocarbon of 6 to 13 carbon atoms or such hydrocarbon substituted with a member selected from the group consisting of vinyl, allyl, ether, ester and carbonyl groups, B is a

in which m and n each is 0 or 1, D is a repeating unit represented by the formula:

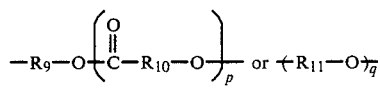

$R_9$ is ethylene or propylene, $R_{10}$ is alkylene of 2 to 7 carbon atoms, $R_{11}$ is alkylene of 2 to 5 carbon atoms, p and q each is an average number of the parenthesized repeating unit and p is 1 to 10 and q is 2 to 50, E is a carboxylic acid or sulfonic acid group, and 97 to 20 parts by weight of another α,β-ethylenically unsaturated copolymerizable monomer, the solid weight ratio of said acrylic resin to quinone diazide compound being 100:5 to 100:150.

* * * * *